(12) United States Patent
Hellberg (10) Patent No.: US 12,362,709 B2
(45) Date of Patent: Jul. 15, 2025

(54) SEQUENTIAL CONTINUOUS WIDEBAND AMPLIFIERS

(71) Applicant: Telefonaktiebolaget LM Ericsson (publ), Stockholm (SE)

(72) Inventor: Richard Hellberg, Huddinge (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 662 days.

(21) Appl. No.: 17/641,706

(22) PCT Filed: Sep. 10, 2019

(86) PCT No.: PCT/SE2019/050851
§ 371 (c)(1),
(2) Date: Mar. 9, 2022

(87) PCT Pub. No.: WO2021/049983
PCT Pub. Date: Mar. 18, 2021

(65) Prior Publication Data
US 2022/0329208 A1 Oct. 13, 2022

(51) Int. Cl.
*H03F 1/02* (2006.01)
*H03F 1/56* (2006.01)
(Continued)

(52) U.S. Cl.
CPC ............. *H03F 1/0288* (2013.01); *H03F 1/56* (2013.01); *H03F 3/195* (2013.01); *H03F 3/245* (2013.01);
(Continued)

(58) Field of Classification Search
CPC .......... H03F 1/0288; H03F 1/56; H03F 3/195; H03F 3/245; H03F 3/604; H03F 3/607; H03F 2200/423; H03F 2200/451
(Continued)

(56) References Cited

U.S. PATENT DOCUMENTS

| 4,543,535 A | 9/1985 | Ayasli |
| 6,861,903 B1 | 3/2005 | Behel et al. |

(Continued)

FOREIGN PATENT DOCUMENTS

| EP | 2 145 385 A2 | 1/2010 |
| EP | 2 568 598 A1 | 3/2013 |

(Continued)

OTHER PUBLICATIONS

Introduction to Modern planar transmission lines, Anand K. Verma, Wiley-IEEE press, pp. 261-299, 2021 (Year: 2021).*

(Continued)

*Primary Examiner* — Hafizur Rahman
(74) *Attorney, Agent, or Firm* — Rothwell, Figg, Ernst & Manbeck, P.C.

(57) ABSTRACT

A power amplifier arrangement (100) for amplifying an input signal (Pin) to produce an output signal (Pout) is disclosed. The amplifier arrangement (100) comprise an input port (IN) for receiving the input signal; an output transmission line (110) having a first terminal (111) and a second terminal (112); an output port (OUT) coupled to the second terminal (112) of the output transmission line (110) for providing the output signal; and a plurality N of amplifying devices (121, 122, . . . 12N) distributed along the output transmission line (110). The power amplifier arrangement (100) is configured such that the plurality N of amplifying devices are active sequentially for amplifying the input signal with increasing amplitude of the input signal.

14 Claims, 12 Drawing Sheets

(51) Int. Cl.
  *H03F 3/195* (2006.01)
  *H03F 3/24* (2006.01)
  *H03F 3/60* (2006.01)

(52) U.S. Cl.
  CPC ............. *H03F 3/604* (2013.01); *H03F 3/607* (2013.01); *H03F 2200/423* (2013.01); *H03F 2200/451* (2013.01)

(58) Field of Classification Search
  USPC ..................................................... 330/124 R
  See application file for complete search history.

(56) References Cited

U.S. PATENT DOCUMENTS

| | | | |
|---|---|---|---|
| 7,508,267 B1 | 3/2009 | Yu et al. | |
| 10,680,564 B2 * | 6/2020 | Esmael | H03F 1/3205 |
| 2018/0102743 A1 * | 4/2018 | Hellberg | H03F 3/605 |

FOREIGN PATENT DOCUMENTS

| | | |
|---|---|---|
| GB | 2 143 392 A | 2/1985 |
| WO | 2016/056952 A1 | 4/2016 |
| WO | 2016/182485 A1 | 11/2016 |
| WO | 2017/082776 A1 | 5/2017 |
| WO | 2017/108874 A1 | 6/2017 |

OTHER PUBLICATIONS

International Search Report and Written Opinion dated Jun. 9, 2020 in International Application No. PCT/SE2019/050851 (10 pages total).

Willems, D. et al., "High Voltage Distributed Amplifier", Electronics Letters, Dec. 5, 1991, vol. 27, No. 25, pp. 2369-2370, IEEE Stevenage, Great Britain, XP000253738 (2 pages total).

Doherty, W.H., "A New High Efficiency Power Amplifier for Modulated Waves", Proceedings of the Institute of Radio Engineers, Sep. 1936, vol. 24, No. 9, pp. 1163-1182 (20 pages total).

* cited by examiner

1210. Activating sequentially the plurality N of amplifying devices with increasing amplitude of the input signal 1211. Decreasing gate biases of the plurality N of amplifying devices along the output transmission line 1212. Increasing drain biases to the plurality N of amplifying devices along the output transmission line 1220. Increasing drive signal amplitudes to the plurality N of amplifying devices along the output transmission line

SEQUENTIAL CONTINUOUS WIDEBAND AMPLIFIERS

CROSS REFERENCE TO RELATED APPLICATION(S)

This application is a 35 U.S.C. § 371 National Stage of International Patent Application No. PCT/SE2019/050851, filed Sep. 10, 2019.

TECHNICAL FIELD

Embodiments herein relate to an amplifier arrangement. In particular, they relate to power amplifier arrangement comprising a plurality of amplifying devices. Further, the embodiments relate to an electronic device such as a transmitter, a base station, a user equipment in a wireless communication system comprising the amplifier arrangement.

BACKGROUND

In a wireless communication system, a transmitter employs power amplifiers (PA) to boost radio frequency (RF) signal power for transmission. A PA is expected to amplify input signals linearly and generate output signals with larger power but with identical characteristics to the input signals. However, in reality, PAs can never be made perfectly linear due to intrinsic nonlinearity of active devices e.g. transistors in PAs. Consequently, in reality, a PA, when amplifying signals, also generates distortion signals. Various techniques exist to construct PAs with inherent linearity. Among these techniques, the one that is most widely used and almost universally applied in wireless infrastructures is Doherty Power Amplifiers (DPA).

The Doherty power amplifier has two interconnected amplifier stages with one transistor in each. It has better efficiency than a one-stage amplifier since at low amplitudes the first transistor stage is used alone with higher efficiency due to impedance transformation i.e. increase of the load by a quarter-wave transformer, often called impedance-inverter. In a high amplitude range both first and second stages are used and the apparent load to the first transistor decreases as the contribution from the second transistor increases. At full output power the two stages are combined in-phase with equal voltage amplitudes and the impedance transformation vanishes. This operation causes the RF current to be lower compared to that of a single transistor amplifier at all amplitudes except the maximum. The DC current consumption is thereby also lowered since it is largely proportional to the RF current when typically class B or AB current waveforms are used. The use of an impedance-inverter has the unwanted consequence of making the high efficiency operation of the amplifier narrowband.

A new class of RF power amplifiers has been disclosed in PCT/SE2014/051156. These amplifiers generally have Doherty-like efficiency and this high efficiency may be achieved in very large relative bandwidths. A way to simplify their design and extend the amplitude range of high efficiency has also been described in PCT/SE2015/050529. These amplifiers are based on multiple sections with distributed groups of sub-amplifiers that may be independently designed and combined in many ways. The amplitude range of high efficiency is extended by connecting several sections in succession, each section adding an amplitude range of a certain number of decibels of high-efficiency performance. By using more sections, the amplitude range of each may be reduced and the efficiency "droop" between transition points may be reduced.

The main problem with extending the amplitude range of high efficiency and reducing the efficiency droop by using more sub-amplifier sections is that the total electrical length of the amplifier system gets large. It may get improved performance on the theoretical efficiency curve, but with diminishing returns. At the same time, it gets increased losses from the extra transmission line length of each added amplifier group. At some point, the net result will be negative.

SUMMARY

Therefore, it is an object of embodiments herein to provide a power amplifier with improved performance and at the same time with reduced size and complexity.

According to one aspect of embodiments herein, the object is achieved by a power amplifier arrangement for amplifying an input signal to produce an output signal. The power amplifier arrangement comprises an input port for receiving the input signal, an output transmission line having a first terminal and a second terminal, an output port coupled to the second terminal of the output transmission line for providing the output signal.

The power amplifier arrangement further comprises plurality N of amplifying devices. The plurality N of amplifying devices are distributed along the output transmission line. Outputs of the plurality N amplifying devices are coupled to the output transmission line at different places with a distance between the different places along the output transmission line from the first terminal to the second terminal of the output transmission line. Inputs of the plurality N of amplifying devices are coupled to the input port. The power amplifier arrangement is configured such that the plurality N of amplifying devices are active sequentially for amplifying the input signal with increasing amplitude of the input signal.

The power amplifier arrangement according to the embodiments herein comprises a number of amplifier devices e.g. transistors distributed along an output transmission line. In operation, the transistors turn on sequentially with increasing amplitude generally long before the previous transistor's voltage swing has reached its maximum. This may be done by having gate bias a little lower for each transistor along the output transmission line, i.e. gate biases to the plurality of amplifying devices are decreasing along the output transmission line from the first terminal to the second terminal. In this way, with each turned-on transistor, the length of the active part of the power amplifier arrangement is increased.

In a preferred embodiment, the admittance along a major part of the output transmission line may change as an exponential function. The working conditions for each additional turned on transistor will thus be similar. This means that the bandwidth may also be kept similarly high at all input signal amplitudes.

The embodiments herein give wideband high-efficiency performance comparable to that of the prior art, but with significantly reduced transmission line length. The total length is typically shorter than two sections of a prior art implementation, and often only about 50% longer than a single section.

The number of amplifier transistors may typically be reduced by a similar figure while their combined maximum output power remains the same. The embodiments herein thus reduce the size and complexity of the amplifier and the transmission line losses may be substantially lowered.

The power amplifier arrangement may also be easier to linearize with a pre-distorter since the combining of many overlapping output current contributions makes the final output smooth. It is also possible to improve the linearity by adjusting e.g. the gate bias to individual transistors.

Therefore, embodiments herein provide smaller, simpler power amplifiers with lower loss, while retaining a large bandwidth compared to the prior art.

BRIEF DESCRIPTION OF THE DRAWINGS

Examples of embodiments herein are described in more detail with reference to attached drawings in which.

DETAILED DESCRIPTION

Figure 1:
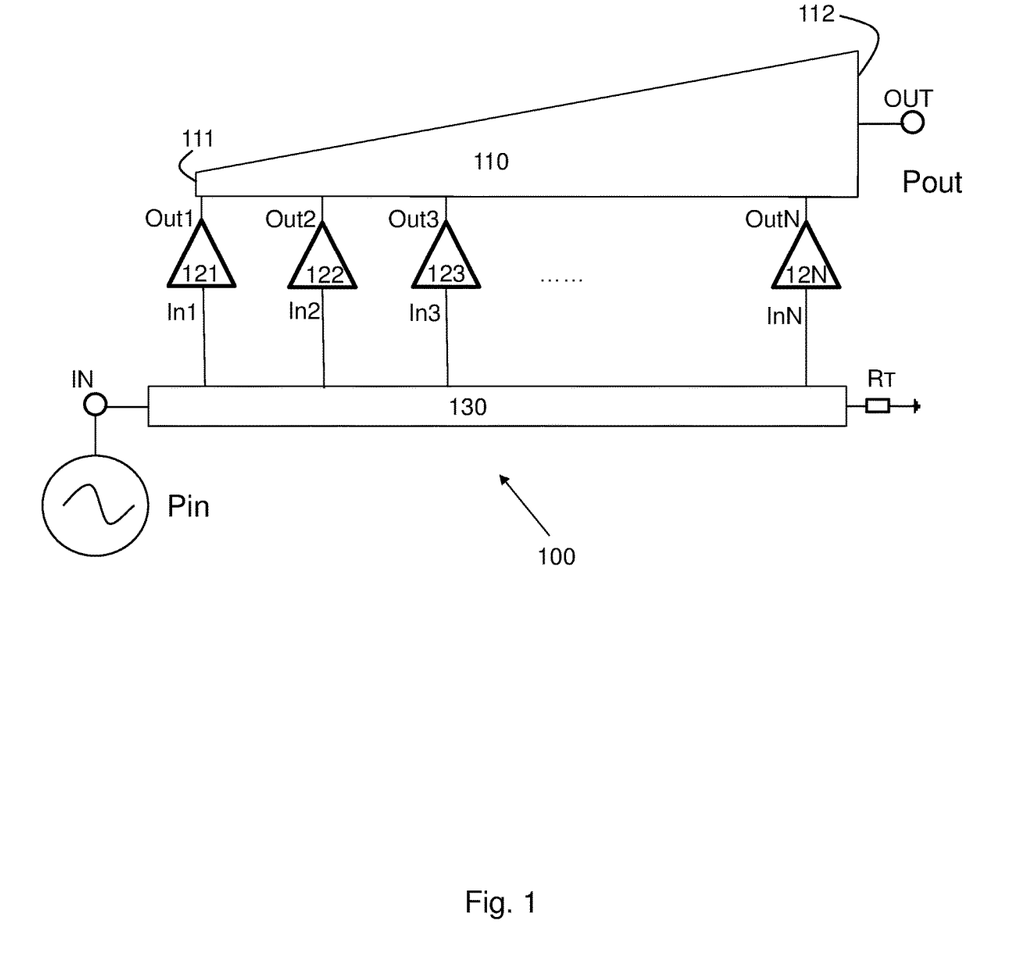
FIG. 1 is a schematic block diagram illustrating an amplifier arrangement according to embodiments herein.

FIG. 1 shows a schematic block diagram of an amplifier arrangement 100 for amplifying an input signal Pin to an output signal Pout for delivery to a load according to embodiments herein. The amplifier arrangement 100 comprises an input port IN for receiving the input signal. The amplifier arrangement 100 further comprises an output transmission line 110 having a first terminal 111 and a second terminal 112. The amplifier arrangement 100 further comprises an output port OUT coupled to the second terminal 112 of the output transmission line 110 for providing the output signal.

The amplifier arrangement 100 further comprises a plurality N of amplifying devices 121, 122, . . . 12N. The plurality N of amplifying devices are distributed along the output transmission line 110. Outputs Out1, Out2, . . . OutN of the plurality N amplifying devices are coupled to the output transmission line 110 at different places with a distance between the different places along the output transmission line from the first terminal 111 to the second terminal 112 of the output transmission line 112. Inputs In1, In2, . . . InN of the plurality N of amplifying devices are coupled to the input port IN.

The power amplifier arrangement (100) is configured such that the plurality N of amplifying devices are active sequentially for amplifying the input signal with increasing amplitude of the input signal.

The plurality N of amplifying devices may be transistors distributed along an output transmission line at drain side. The output transmission line may have a gradually varying admittance, i.e. 1/impedance. Typically, the transistors turn on sequentially with increasing input signal amplitude and generally long before the previous transistor's voltage swing has reached its maximum. Each turned-on transistor thus increases the length of the active part of the amplifier arrangement. There are several alternatives to configure the plurality N of amplifying devices such that they are active sequentially with increasing amplitude of the input signal.

According to some embodiments, this may be done by having the gate bias is a little lower for each transistor along the output transmission line. That is the gate biases to the plurality N of amplifying devices are decreasing along the output transmission line 110 from the first terminal 111 to the second terminal 112.

According to some embodiments, the drain biases to the plurality N of amplifying devices may be increasing along the output transmission line 110 from the first terminal to the second terminal 120.

According to some embodiments, the output transmission line may have decreasing characteristic impedance along the output transmission line 110 from the first terminal 111 to the second terminal 112.

According to some embodiments, the output transmission line may have exponentially increasing admittance along the transmission line 110 from the first terminal 111 to the second terminal 112. In an exemplary embodiment the admittance along a major part of the output transmission line may change as an exponential function. The working conditions for each additional turned on transistor will thus be similar. This means that the bandwidth may also be kept similarly high at all input signal amplitudes.

A simple and good output transmission line structure may thus have an exponentially changing characteristic impedance. An output transmission line with exponential line structure has largely the same frequency response looking towards the output at any point along the line, but with scaled impedance level. This means that any range of active transistors up to a point along the line will have about the same working conditions as a range of active transistors up to another point. However, many other impedance profiles will also work.

Figure 2:
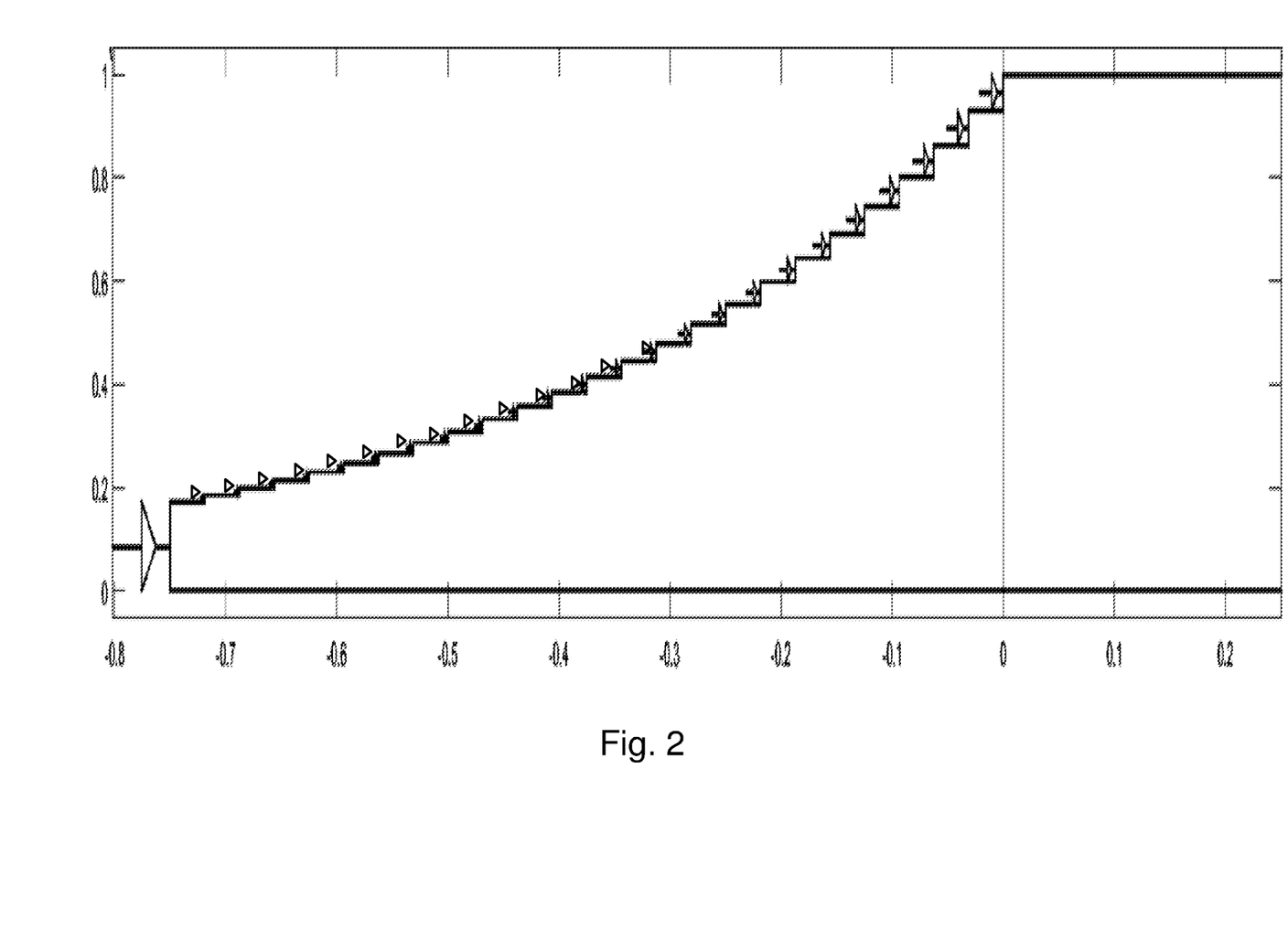
FIG. 2 is a schematic block diagram illustrating an amplifier arrangement according to an embodiment herein.

FIG. 2 shows an example embodiment of an amplifier arrangement with a discretized exponential output transmission line and with 24 amplifier devices shown as triangle symbols. Each amplifier device may be a single transistor, push-pull pair or other arrangement connected to the output transmission line at regular intervals. The width of the output transmission line is here used to show the admittance, which is largely true in real circuits with constant, thin, dielectric coefficient.

The leftmost amplifier device works alone at the lowest input signal amplitudes, with more joining from left to right with increasing input signal amplitude.

The amplifier device may be a common-source coupled transistor. The transistors are driven with gate drive voltages largely in sync with the voltages on the output transmission line, timing wise. Phase is inverted due to the inverting property of the common-source coupled transistors. This may be achieved by various arrangements known in the art. For the following examples, an input transmission line at gate-side has the gates of the transistors connected at points with the same electrical length between them as their respective drains are connected along the output transmission line.

Therefore, according to some embodiments herein, the inputs of the amplifying devices may be coupled to the input port via an input transmission line. The inputs of the amplifying devices are coupled to the input transmission line at different places with a distance between the different places along the input transmission line from a first terminal to a second terminal of the input transmission line, and the input transmission line has gradually increasing impedance from the first terminal to the second terminal.

A typical way to activate different amplifier stages at different input signal amplitudes may be to have lower gate bias for each successive stage, i.e. 'deeper' class C bias. This method may be implemented to the present embodiments, preferably with each successive transistor towards the output having a little lower gate bias than the previous one. With gate bias a little lower for each transistor along the output transmission line towards the output, the transistors further to the output are active at successively higher input signal amplitudes.

Example Embodiment 1

Main Amplifier+16 Transistors, Bandwidth 0.4 to 3.2 GHz

Figure 3:
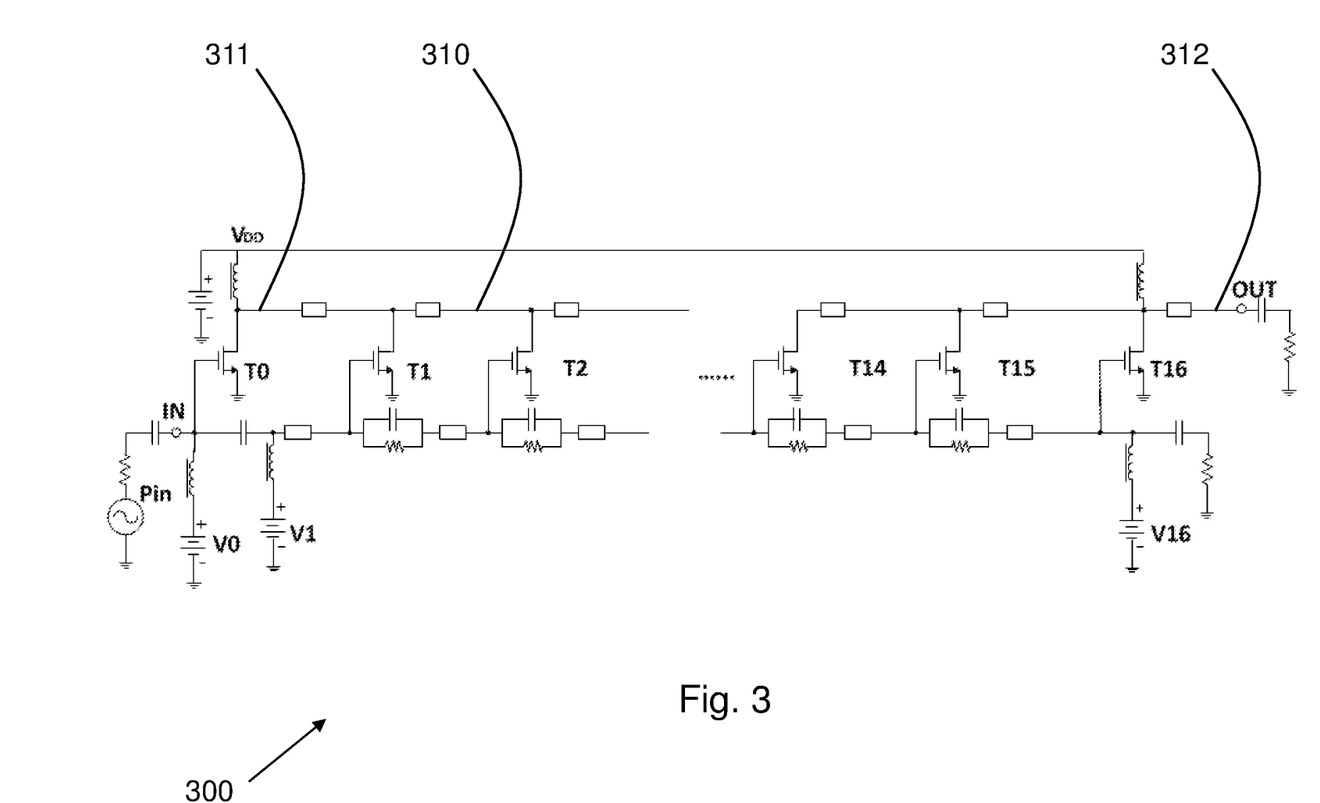
FIG. 3 is a schematic circuit diagram illustrating an amplifier arrangement according to an embodiment herein.

A schematic circuit example of a power amplifier arrangement 300 according to embodiments herein is shown in FIG. 3. It has one transistor T0 as a first, i.e. main, amplifier, followed by 16 equal size transistors T1, T2 . . . T14, T15, T16, i.e. peak amplifiers, distributed along an output transmission line 310 with exponential taper. The output transmission line 310 has a first terminal 311 coupled to the main transistor T0 and a second terminal 312 coupled to the output port Out. The size of the main transistor is twice the size of the other ones, i.e. it delivers twice the output current under similar drive conditions. The lower corner frequency is at 400 MHz and the upper at 3.2 GHz, i.e. an 8:1 frequency ratio, 3 octaves.

Since the peak transistors are of equal size, the admittance steps in the output transmission line where they are placed are preferably also equal in size. The exponential taper is then achieved here by having greater length between the admittance steps in the beginning of the transmission line, i.e. the distances between the different places of the transistors along the output transmission line in the beginning of the transmission line is larger, and successively shorter towards the output, i.e. the second terminal 312 of the output transmission line 310.

The transmission line lengths between the transistors, i.e. the distances between the different places along the output transmission line, given in electrical length degrees at the lower end of the desired frequency range, are given in the table below. The total length is here 287 degrees, i.e. a little more than ¾ wavelength, at the lower corner frequency. This is about 30 to 60% longer than for a stage of a prior art multistage amplifier. E0 is the length of transmission line between the first (main) transistor and the next transistor, while E1 to E15 are the lengths between the rest of the transistors.

| E0 | E1 | E2 | E3 | E4 | E5 | E6 | E7 |
| --- | --- | --- | --- | --- | --- | --- | --- |
| 26.717 | 25.205 | 23.778 | 22.432 | 21.162 | 19.965 | 18.834 | 17.768 |
| E8 | E9 | E10 | E11 | E12 | E13 | E14 | E15 |
| 16.763 | 15.814 | 14.919 | 14.074 | 13.278 | 12.526 | 11.817 | 11.148 |

The main transistor is typically biased in class B or AB for linearity, which is for example, at gate voltages V0 between −4 and −3 volts relative to the source node for Gallium—nitride power transistors (GaN HEMT). The rest of the transistors are biased from class B to class C with lower and lower voltage towards the output, starting at V1=−4 and ending at V16=−8 volts. The individual gate bias voltages for the intermediate transistors may be obtained for example by a string of resistors fed at one end with the starting voltage and at the other with the ending voltage. In the present examples all voltage differences between subsequent gate biases are equal and may thus be obtained by a string of equal valued resistors.

Figure 4:
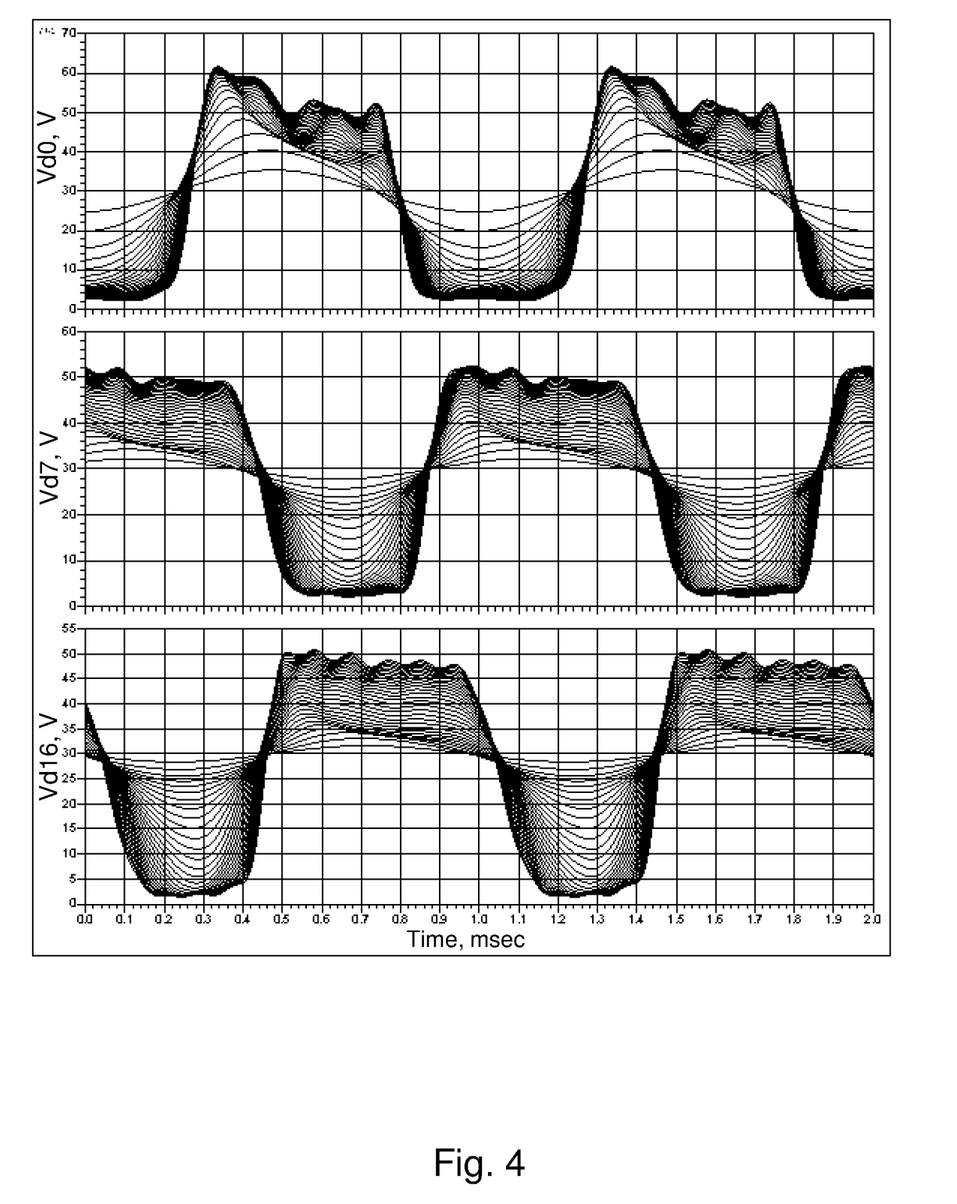
FIG. 4 is a diagram illustrating voltage waveforms at different points along the output transmission line for the amplifier arrangement in FIG. 3.

FIG. 4 shows typical voltage waveforms at different points along the output transmission line, with input signal amplitude swept from minimum to maximum, for a frequency of 1 GHz. The uppermost plot is the voltage at the first transistor's drain, the middle plot shows the voltage at the drain of the 7:th transistor, and the lowermost plot shows the voltage at the drain node of the 16:th, i.e. the last, transistor. It can be seen that the first transistor's voltage traces are very much compressed to a wide, square-like wave shape for a large part of the input signal amplitudes, i.e. many traces close together at a few volts above zero. For the 7:th transistor, fewer voltage waveforms are compressed and many of the waveforms are close to an ideal, negative half-sine shape. For the 16:th transistor that is closest to the output it can be seen that even more of the waveforms are closer to the ideal, negative half-sine shape.

Figure 5:
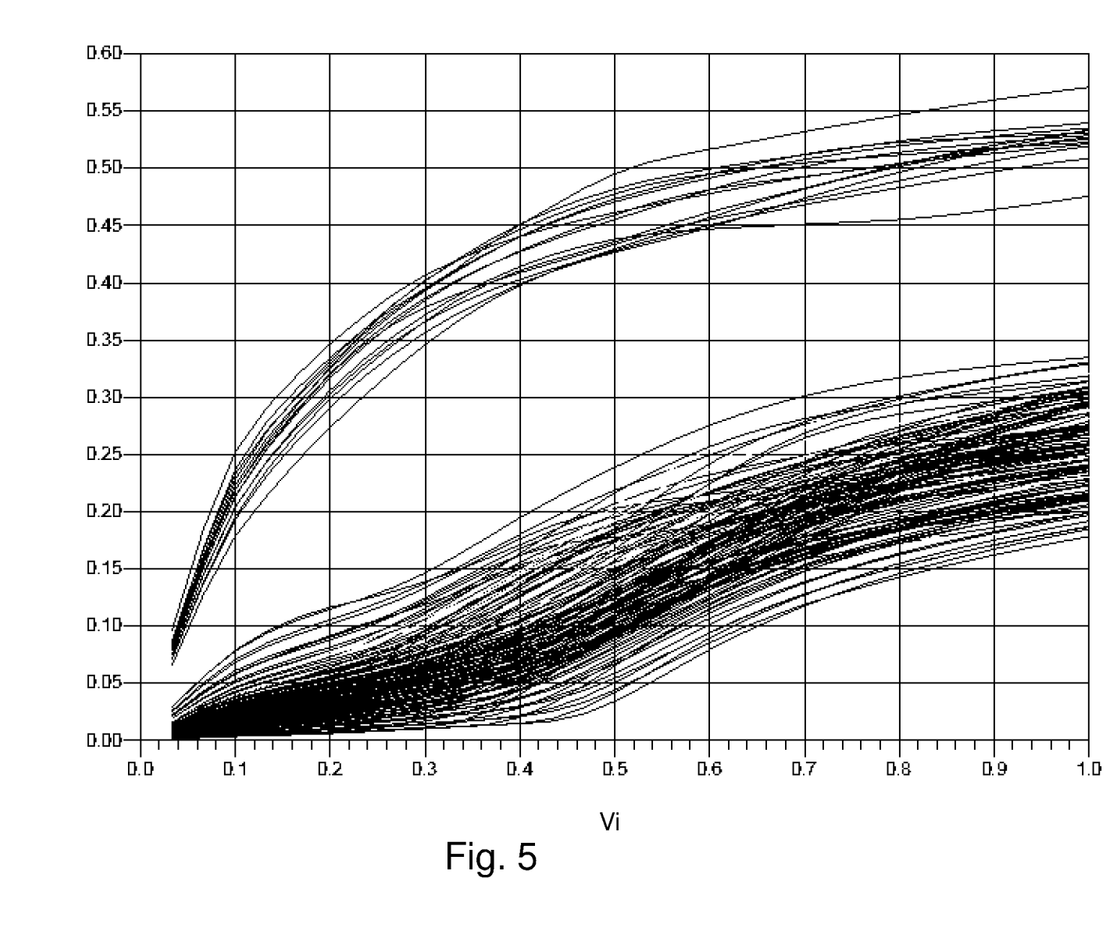
FIG. 5 is a diagram illustrating fundamental current amplitudes for a selection of different transistors along the output transmission line for the amplifier arrangement in FIG. 3.

FIG. 5 shows the fundamental current amplitudes for a selection of different transistors along the output transmission line, taken at regularly spaced frequencies over the whole range from 400 MHz to 3.2 GHz. The leftmost/uppermost curves show the fundamental output current of the main transistor, which as previously stated are of roughly twice the magnitude of those of the rest of the transistors at high input signal amplitudes. The current increases rapidly at low input signal amplitudes and then compresses, with only little increase above the input signal amplitude 0.4. The rest of the transistors have different current amplitude curves with respect to the input signal amplitude, here represented by the drive signal linear scale factor vi, and also have variations due to frequency dependencies, i.e. frequency ripple, in the local conditions at the input/gate and output/ drain transmission lines. The first transistors along the output transmission line, having the highest bias voltage, have high output current amplitude at low input signal amplitudes, whereas the later ones start contributing significantly at higher input signal amplitudes. For example, the one closest to the output delivers very little at input signal amplitudes less than 0.45. The deeper class C bias also means that the output current is generally smaller for the transistors closer to the output, which can also be seen in the plot shown by the lower rightmost curves.

Figure 6:
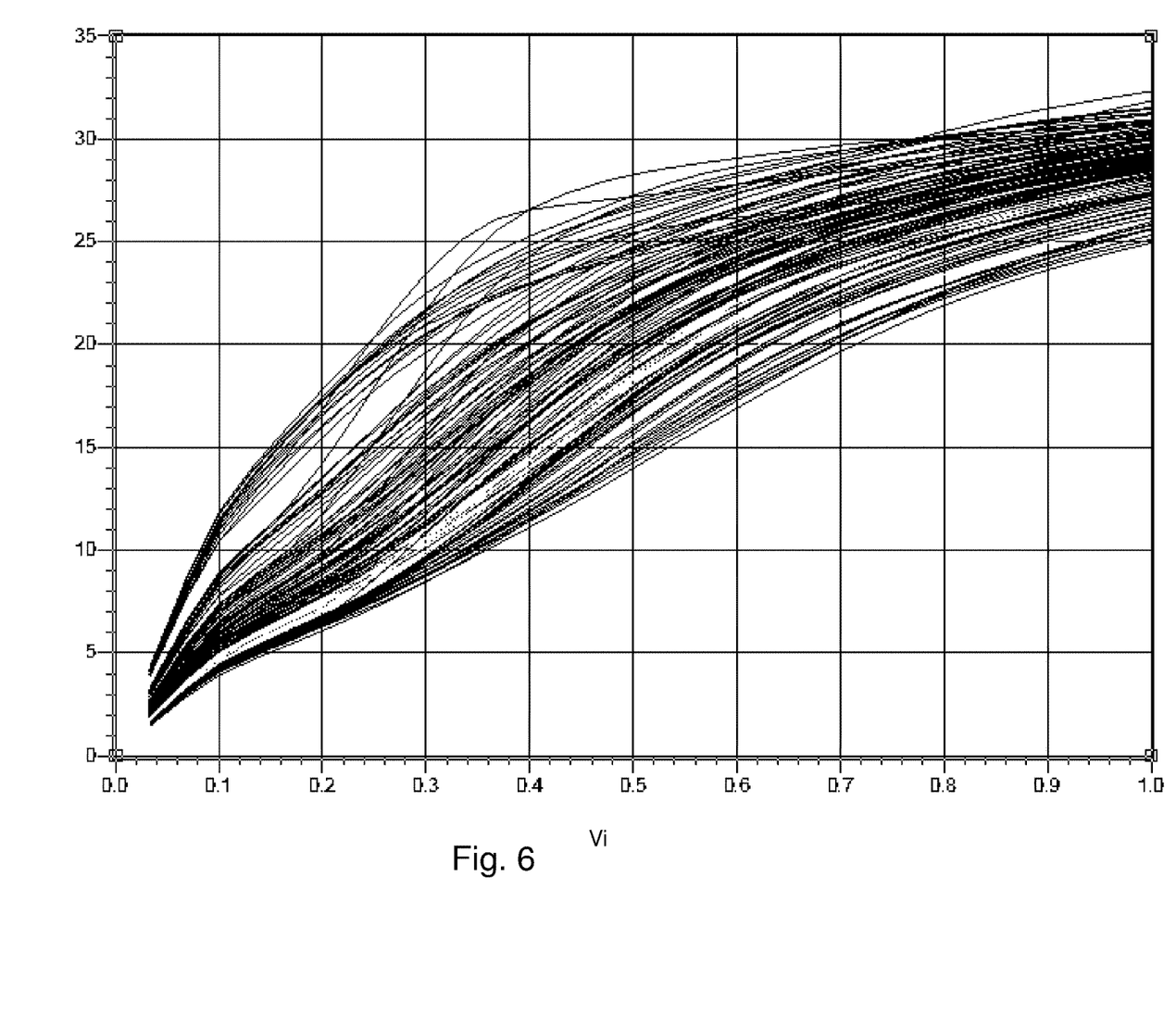
FIG. 6 is a diagram illustrating drain voltage swings for the same selection of transistors along the output transmission line for the amplifier arrangement in FIG. 3, at the same frequencies.

FIG. 6 shows the drain RF voltage swings for fundamental tone magnitude for the same selection of transistors along the output transmission line, at the same frequencies.

It can be seen that the main transistor drain voltage swing, shown by the leftmost curves, increases rapidly at low input signal amplitudes before it tapers off due to compression, with only little increase above input signal amplitude 0.4. The rest of the voltages have less and less compression for the transistors towards the output, with the fundamental voltage at the output node being relatively linear.

Figure 7:
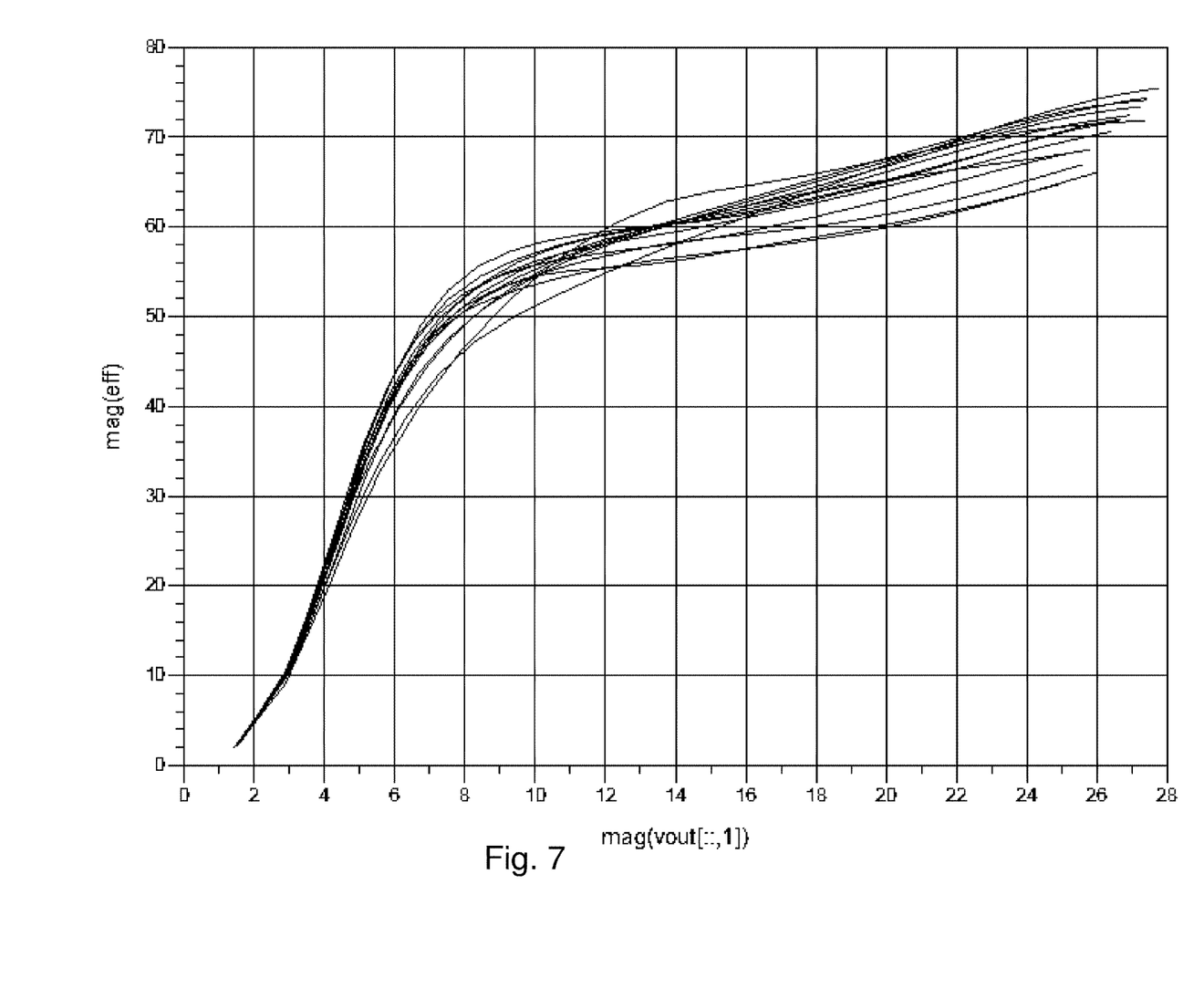
FIG. 7 is a diagram illustrating drain efficiency curves for the same set of frequencies over the whole bandwidth for the amplifier arrangement in FIG. 3.

FIG. 7 shows the drain efficiency curves for the same set of frequencies over the whole bandwidth from 0.4 to 3.2 GHz, plotted against output amplitude. It can be seen that it has relatively high and flat efficiency for all amplitudes above about 8 volts.

The gain of the amplifier device depends on many factors. A special problem is the drain-gate capacitance of the transistors, which provides a feedback path that can lead to instability. Some countermeasures against this are for example having a low characteristic impedance input transmission line for feeding input signal to the gates and providing resistance in series with the gates. Both techniques are used in this example.

Using a single input transmission line to feed many transistors gives high gain, if gate capacitances can be properly absorbed into the input transmission line capacitance.

Figure 8:
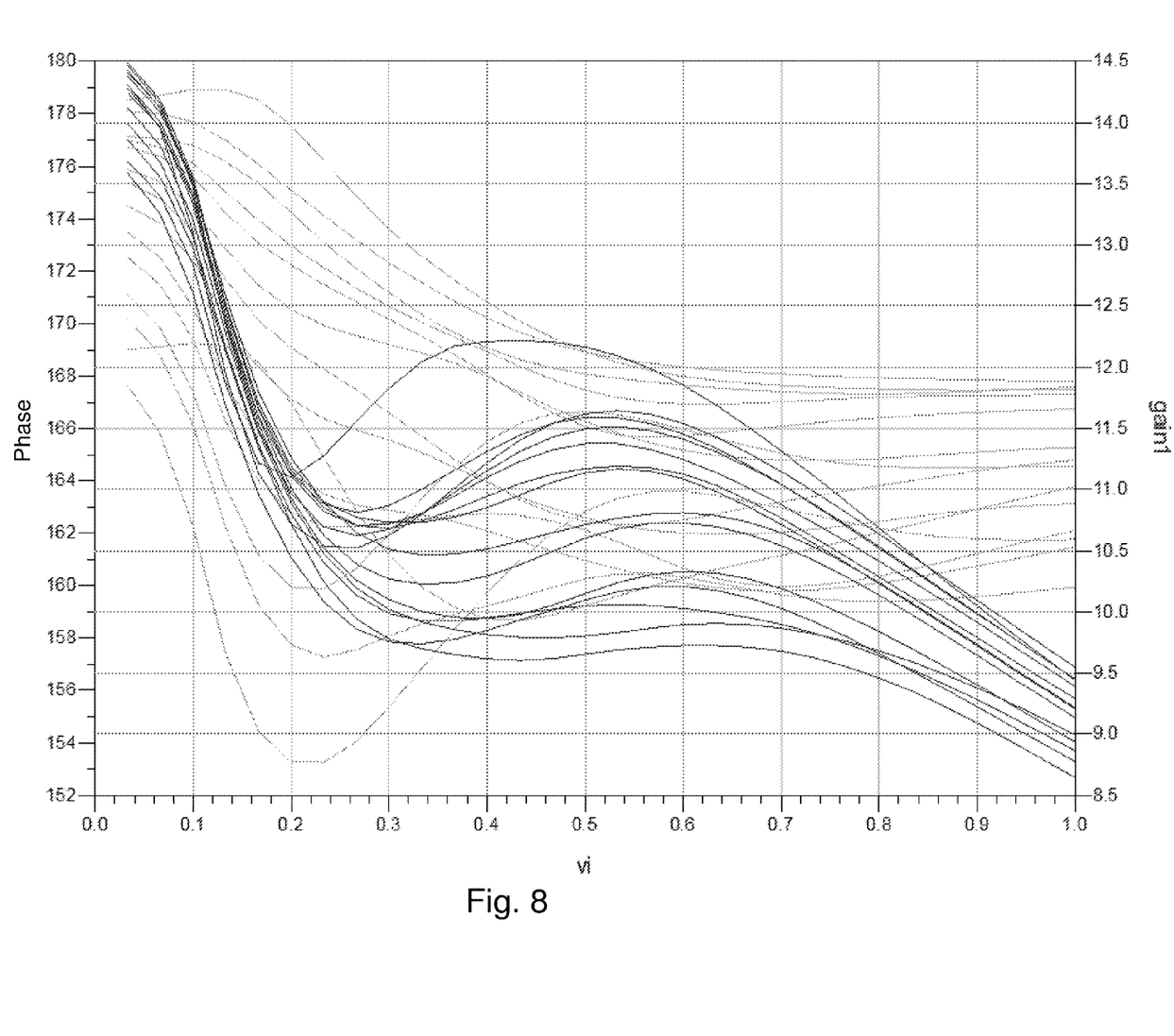
FIG. 8 is a diagram illustrating gain and phase over amplitude for the amplifier arrangement in FIG. 3, across the whole bandwidth from 0.4 to 3.2 GHz.

FIG. 8 shows the gain in decibels with dark curves and phase in degrees with gray curves over the input signal amplitude for the amplifier devices in the example, across the whole bandwidth from 0.4 to 3.2 GHz. The gain is high at low input signal amplitudes, relatively flat at medium input signal amplitudes, and compresses at high input signal amplitudes. If it is a problem, the higher gain at low input signal amplitudes may be avoided by having a separate, lower amplitude, drive signal to the main transistor, or by capacitive dividing the voltage at the gate drive line to the same effect.

Figure 9:
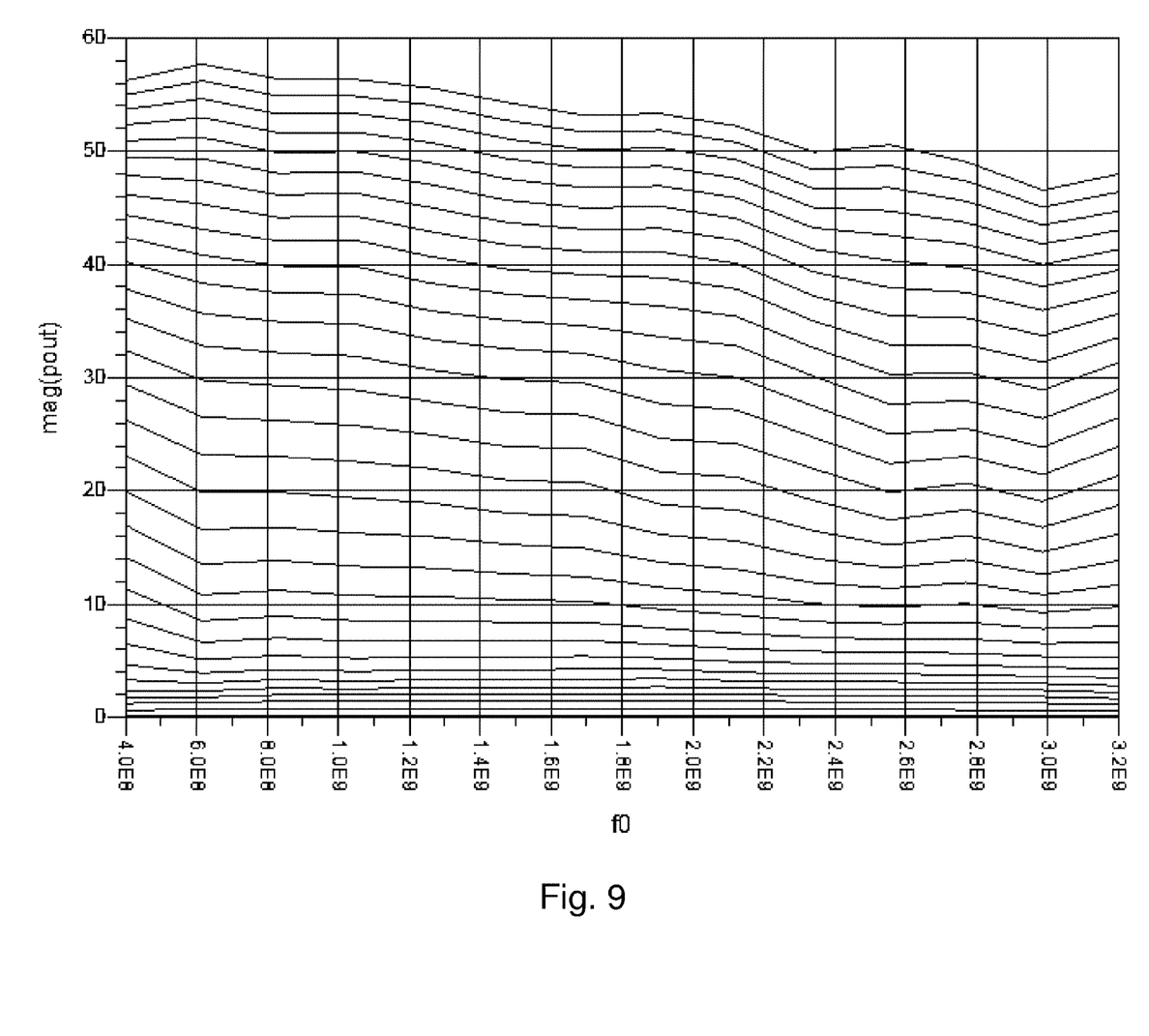

FIG. 9 shows the output power across the bandwidth for the whole input signal amplitude range. It can be seen that the output power for a certain input drive signal level is relatively flat with frequency but has a droop towards the higher frequencies.

Figure 10:
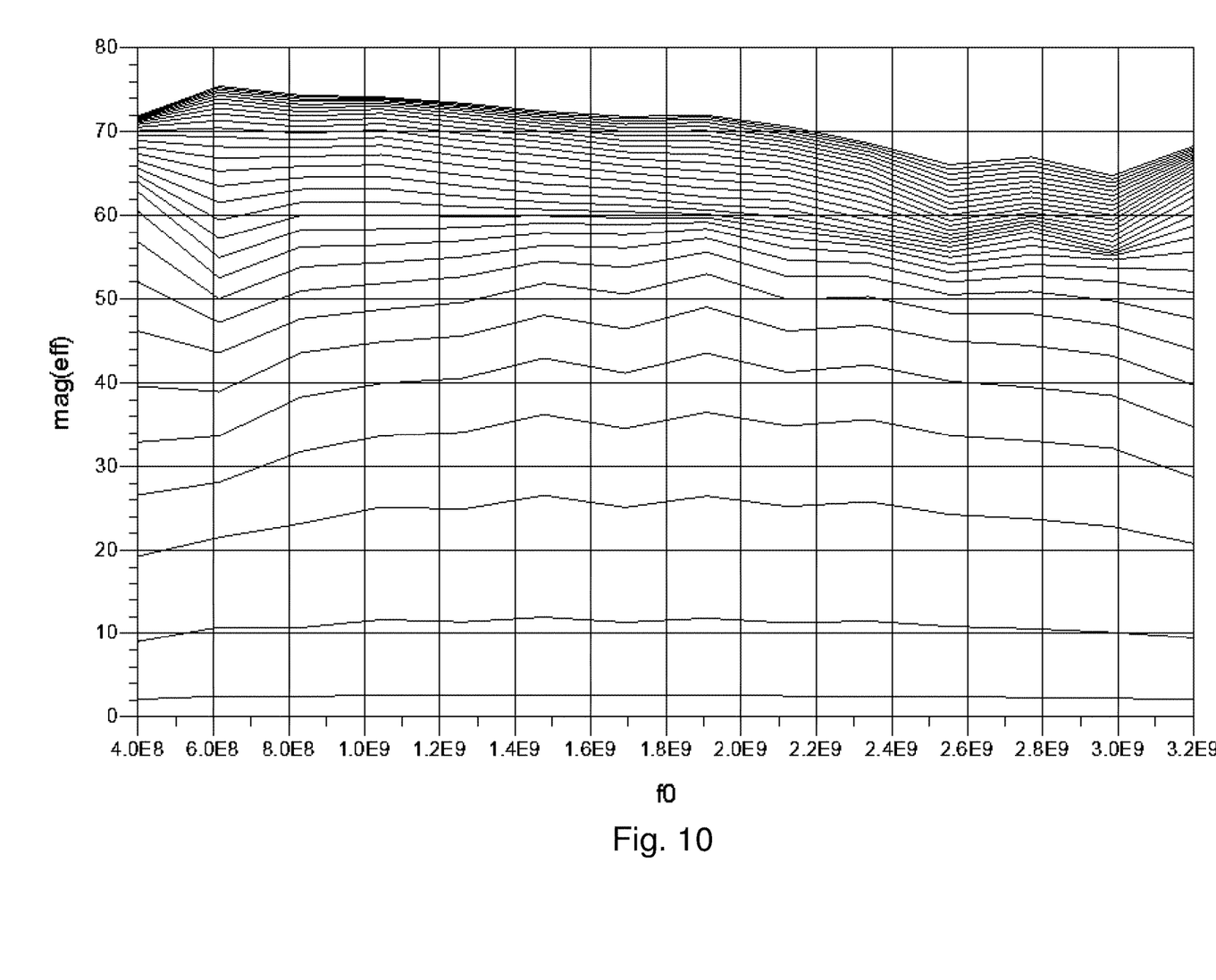
FIG. 10 is a diagram illustrating output power across the bandwidth, for the whole input signal amplitude range for the amplifier arrangement in FIG. 3.

FIG. 10 shows the efficiency across the bandwidth for the whole input signal amplitude range. It can be seen that the efficiency is above 60% for higher input signal amplitudes.

Example Embodiment 2

Main Amplifier+6 Transistors, Bandwidth 1.8 to 3.8 GHz

Figure 11:
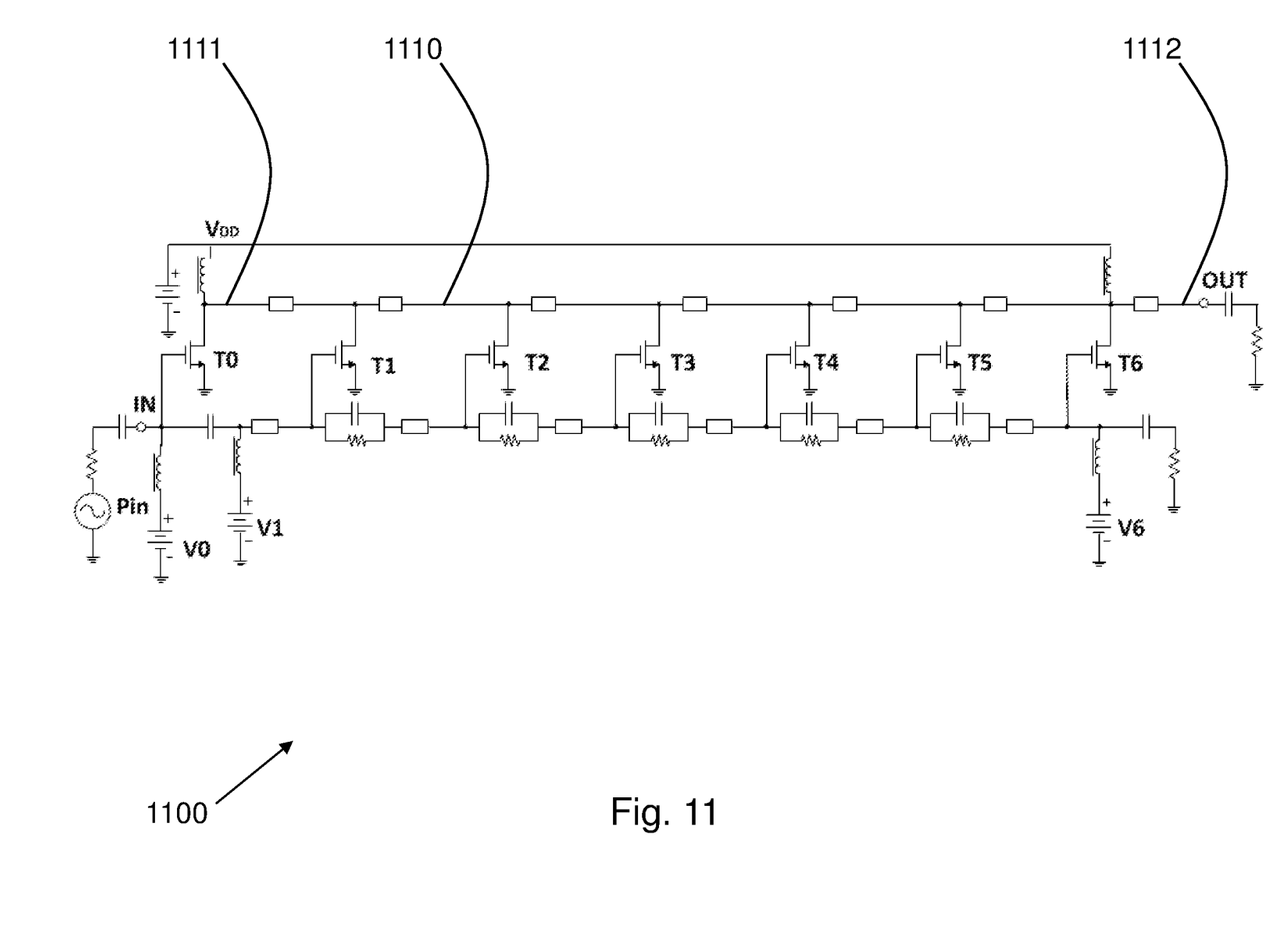
FIG. 11 is a schematic circuit diagram illustrating an amplifier arrangement according to an embodiment herein.

Another circuit example of a power amplifier arrangement 1100 according to embodiments herein is shown in FIG. 11. The amplifier arrangement 1100 has one transistor T0 as a first main amplifier, followed by 6 transistors T1, T2 . . . T6, peak transistors, distributed along an output transmission line 1110 with exponential taper. All transistors are here of the same size and type. The lower corner frequency is at 1.8 GHz and the upper at 3.8 GHz, i.e. a little more than an octave range.

The output transmission line 1110 lengths between the transistors, given in electrical length degrees at the lower end of the desired frequency range, are given in the table below.

| E1 | E2 | E3 | E4 | E5 | E6 | E7 |
|---|---|---|---|---|---|---|
| 56.137 | 52.292 | 48.712 | 45.376 | 42.269 | 39.374 | 36.678 |

The main transistor's gate is here biased at V0=−3 volts relative to the source node, i.e. class AB. The rest of the transistors have their gates biased to give class B to class C operation by having successively lower gate bias voltage towards the output, starting at V1=−4 and ending at V6=−5.5 volts.

Similar simulations have been performed for this example circuit and similar performances as the previous example circuit have been observed.

Even though the embodiments herein have been presented as one section of amplifier devices, it is also possible to use several sections of the embodiments herein in cascade. This may be done by replacing the "main" amplifier with a scaled down, in transistor sizes and power, main amplifier plus peaking amplifier section combination. This may be useful for example in a power amplifier arrangement with feedforward error correction implementations as in patent application WO2017082776.

Due to the high directionality of the peaking section(s), the main amplifier may also be replaced with just about any amplifier that can deliver the required output power.

As it have been seen in the examples, the embodiments herein may be implemented with few or many amplifier devices or transistors depending on the desired bandwidth, efficiency and ripple. The general solutions for increasing the relative bandwidth, reducing the ripple or increasing efficiency is to use more but smaller amplifier devices and increase the total output transmission line length.

A single input transmission line is used in the circuit examples and gives the highest gain in many circumstances. It may however be sub-optimal if the total number of transistors is low, or if there is large feedback capacitance between the output transmission line and the gates. In such circumstances it may be better to use power dividers and impedance matching to each transistor's gate.

In many cases, the most practical way to implement the embodiments herein is to have lower gate bias for each successive transistor in the peaking section. Due to the lower gain this gives for the "later" transistors, there may be an advantage to increase the amplitude of the drive signal to these transistors. This may for example be done by having higher gain in the driver amplifiers to the later transistors or by adjusting the individual matching networks after the power splitters. A simple way to achieve the same effect in the single input transmission line implementation is to gradually increase the impedance of this transmission line along its length. This will gradually increase the voltage swing of the gate drive wave, so that the later transistors are driven by a higher voltage.

Parasitic reactance at the output of the transistors may be handled in many ways. Pure capacitance at the transistor output node may usually be absorbed into the output transmission line, making synthetic transmission lines out of this capacitance and a transmission line of higher impedance. Alternatively, it may use only series inductance, or a combination of inductance and transmission line.

The high efficiency of the embodiments herein may be realized if high-efficiency current waveforms are used, for example class AB, B or C as in the examples. Push-pull coupled transistors may be used for the amplifier devices to get control over the full waveform. Push-pull is generally good for reducing even numbered harmonics and even-order intermodulation, as well as for separating impedance requirements for baseband and RF.

According to some embodiments herein, gate biases to amplifying devices may be adapted individually to increase linearity.

According to some embodiments herein, the drive signal amplitudes to the plurality N of amplifying devices may be increasing along the output transmission line from the first terminal to the second terminal.

Figure 12:
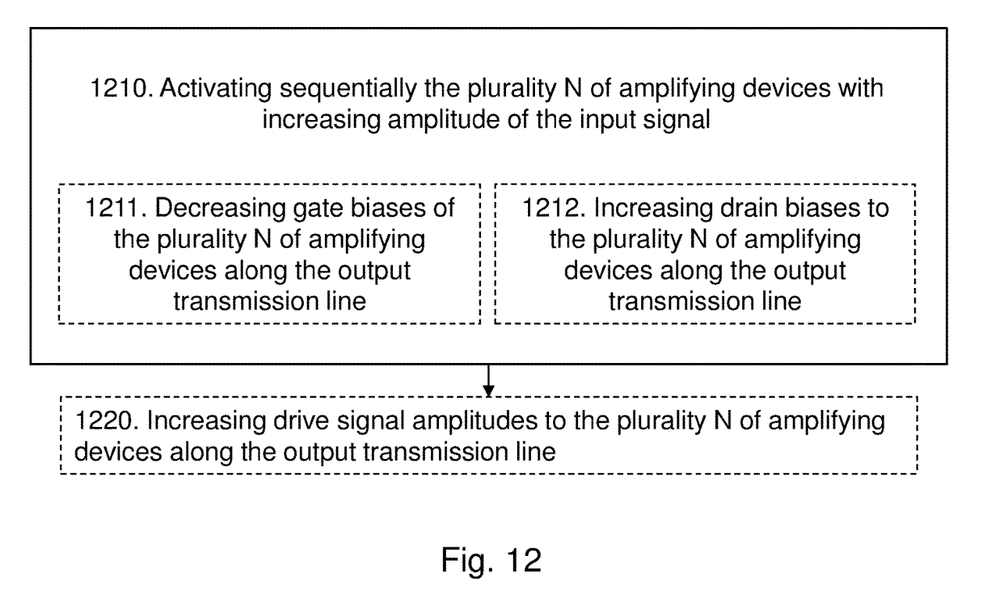
FIG. 12 is a flow chart shows a method of operating an amplifier arrangement according to embodiments herein.

According to the embodiments herein, a method to operate a power amplifier arrangement for amplifying an input signal to produce an output signal is described with reference to FIG. 12.

The power amplifier arrangement comprises an input port for receiving the input signal; an output transmission line having a first terminal and a second terminal; an output port coupled to the second terminal of the output transmission line for providing the output signal; and a plurality N of amplifying devices.

The plurality N of amplifying devices are distributed along the output transmission line, wherein outputs of the plurality N amplifying devices are coupled to the output transmission line at different places with a distance between the different places along the output transmission line from the first terminal to the second terminal of the output transmission line. Inputs of the plurality N of amplifying devices are coupled to the input port.

The method comprises the following actions.

Action 1210

Activating sequentially the plurality N of amplifying devices with increasing amplitude of the input signal.

According to some embodiments herein, activating sequentially the plurality N of amplifying devices may comprise decreasing (1211) gate biases of the plurality N of amplifying devices along the output transmission line from the first terminal to the second terminal.

According to some embodiments herein, activating sequentially the plurality N of amplifying devices may comprise increasing (1212) drain biases to the plurality N of amplifying devices along the output transmission line from the first terminal to the second terminal.

Action 1220

According to some embodiments herein, the method may further comprise increasing drive signal amplitudes to the plurality N of amplifying devices along the output transmission line from the first terminal to the second terminal.

Figure 13:
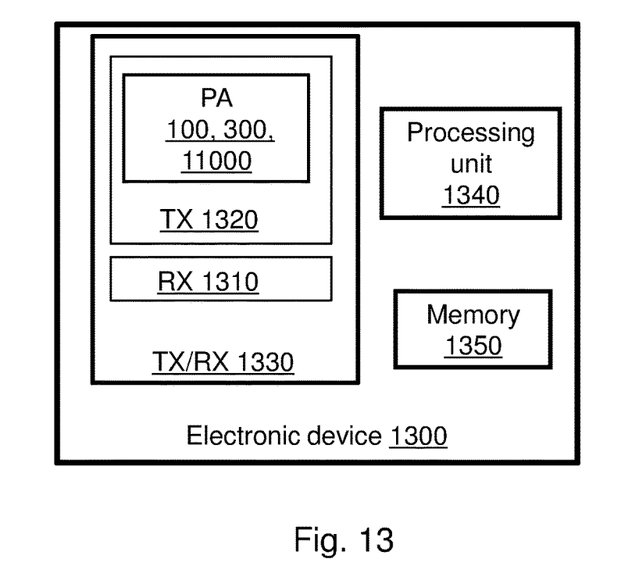
FIG. 13 is a block diagram illustrating an electronic device in which embodiments herein may be implemented.

The amplifier arrangement 100, 300, 1100 according to embodiments herein may be employed in various electronic devices or communication devices, such as radio transmitters, radio base stations, user equipment, mobile stations etc. in a wireless communication system. FIG. 13 shows a block diagram of an electronic device 1300, which may be, e.g. a mobile station, a radio base station, in which the amplifier arrangement 100, 300, 1100 according to embodiments herein may be implemented. The electronic device 1300 may comprise a transceiver TX/RX 1330 comprising a receiver RX 1310 and a transmitter TX 1320. The electronic device 1300 may further comprise a processing unit 1340, a memory 1350 etc.

To summarize, the embodiments herein having following features and advantages:

A plurality of amplifying devices distributed along an output transmission line, where the first amplifier device operates as a main amplifier and the rest of amplifying devices operate as peaking amplifier;

Sequentially turning-on of the distributed peaking amplifier devices with increasing input signal amplitude;

Decreasing gate bias for the distributed amplifier devices along the output transmission line for the simplest implementation of sequentially turning-on of the distributed peaking amplifier devices;

Overlapping operating of the plurality of amplifying devices making the groups or sections of the amplifying devices fused into one continuous group of amplifier devices;

Exponentially increasing admittance of the output transmission line making a good implementation with similar bandwidth for all input signal amplitudes;

Individual adaptation of gate biases for the amplifier devices to increase linearity;

Increasing the drive signal amplitude along the output transmission line for better transistor utilization.

Giving wideband high-efficiency performance comparable to that of the prior art, but with significantly reduced transmission line length. The total length is typically shorter than two sections of a prior art implementation, and often only about 50% longer than a single section.

The number of amplifier transistors may typically be reduced by a similar figure while their combined maximum output power remains the same. The embodiments herein thus reduce the size and complexity of the amplifier and the transmission line losses may be substantially lowered.

The power amplifier arrangement may also be easier to linearize with a pre-distorter since the combining of many overlapping output current contributions makes the final output smooth.

Providing smaller, simpler power amplifiers with lower loss, while retaining a large bandwidth compared to the prior art.

The embodiments herein are not limited to the above described preferred embodiments. Various alternatives, modifications and equivalents may be used. When using the word "comprise" or "comprising" it shall be interpreted as non-limiting, i.e. meaning "consist at least of". Therefore, the above embodiments should not be taken as limiting the scope of the invention, which is defined by the appending claims.

The invention claimed is:

1. A power amplifier for amplifying an input signal to produce an output signal comprising:
   an input port for receiving the input signal;
   an output transmission line having a first terminal and a second terminal;
   an output port coupled to the second terminal of the output transmission line for providing the output signal;
   a plurality N of amplifying devices, wherein
   the plurality N of amplifying devices are distributed along the output transmission line, wherein outputs of the plurality N amplifying devices are coupled to the output transmission line at different places with a distance between the different places along the output transmission line from the first terminal to the second terminal of the output transmission line, inputs of the plurality N of amplifying devices are coupled to the input port and the power amplifier is configured such that the plurality N of amplifying devices are activated sequentially for amplifying the input signal with increasing amplitude of the input signal, wherein the plurality of N amplifying devices comprises a first amplifier (amp1), a second amplifier (amp2), and a third amplifier (amp3), amp1 is coupled to the output transmission line at a first location, amp2 is coupled to the output transmission line at a second location, amp3 is coupled to the output transmission line at a third location, the length from the first location to the second location is greater than the length from the second location to the third location, and no amplifier is coupled to the output transmission line between the first location and the second location.

2. The power amplifier of claim 1, wherein gate biases to the plurality N of amplifying devices are decreasing along the output transmission line from the first terminal to the second terminal.

3. The power amplifier of claim 1, wherein the output transmission line has decreasing characteristic impedance along the output transmission line from the first terminal to the second terminal.

4. The power amplifier of claim 1, wherein the output transmission line has exponentially increasing admittance along the transmission line from the first terminal to the second terminal.

5. The power amplifier of claim 1, wherein drain biases to the plurality N of amplifying devices are increasing along the output transmission line from the first terminal to the second terminal.

6. The power amplifier of claim 1, wherein gate biases to amplifying devices are adapted individually to increase linearity.

7. The power amplifier of claim 1, wherein drive signal amplitudes to the plurality N of amplifying devices are increasing along the output transmission line from the first terminal to the second terminal.

8. The power amplifier of claim 7, wherein the inputs of the amplifying devices are coupled to the input port via an input transmission line, the inputs of the amplifying devices are coupled to the input transmission line at different places with a distance between the different places along the input transmission line from a first terminal to a second terminal of the input transmission line, and the input transmission line has gradually increasing impedance from the first terminal to the second terminal.

9. An electronic device comprising the power amplifier of claim 1.

10. The electronic device of claim 9, wherein the electronic device is a radio base station, a user equipment, a transmitter, or a transceiver in a wireless communication system.

11. A method to operate a power amplifier for amplifying an input signal to produce an output signal, wherein the power amplifier comprises:

an input port for receiving the input signal;

an output transmission line having a first terminal and a second terminal;

an output port coupled to the second terminal of the output transmission line for providing the output signal; and a plurality N of amplifying devices, wherein the plurality N of amplifying devices are distributed along the output transmission line, wherein outputs of the plurality N amplifying devices are coupled to the output transmission line at different places with a distance between the different places along the output transmission line from the first terminal to the second terminal of the output transmission line, and inputs of the plurality N of amplifying devices are coupled to the input, the method comprising:

activating sequentially the plurality N of amplifying devices with increasing amplitude of the input signal, wherein the plurality of N amplifying devices comprises a first amplifier (amp1), a second amplifier (amp2), and a third amplifier (amp3), amp1 is coupled to the output transmission line at a first location, amp2 is coupled to the output transmission line at a second location, amp3 is coupled to the output transmission line at a third location, the length from the first location to the second location is greater than the length from the second location to the third location, and no amplifier is coupled to the output transmission line between the first location and the second location.

12. The method of claim 11, wherein activating sequentially the plurality N of amplifying devices comprises decreasing gate biases of the plurality N of amplifying devices along the output transmission line from the first terminal to the second terminal.

13. The method of claim 11, wherein activating sequentially the plurality N of amplifying devices comprises increasing drain biases to the plurality N of amplifying devices along the output transmission line from the first terminal to the second terminal.

14. The method of claim 11, further comprising increasing drive signal amplitudes to the plurality N of amplifying devices along the output transmission line from the first terminal to the second terminal.

* * * * *